United States Patent
Buttolo et al.

(10) Patent No.: US 10,409,426 B2
(45) Date of Patent: Sep. 10, 2019

(54) MOTION BASED CAPACITIVE SENSOR SYSTEM

(71) Applicant: Ford Global Technologies, LLC, Dearborn, MI (US)

(72) Inventors: Pietro Buttolo, Dearborn Heights, MI (US); Harry Lobo, Canton, MI (US); James Stewart Rankin, II, Novi, MI (US); Kassandra Ritter, Ann Arbor, MI (US); Dipanjan Ghosh, Livonia, MI (US); Stuart C. Salter, White Lake, MI (US); Jessica Smith, Roseville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 263 days.

(21) Appl. No.: 14/686,243

(22) Filed: Apr. 14, 2015

(65) Prior Publication Data

US 2016/0306455 A1 Oct. 20, 2016

(51) Int. Cl.
*G06F 3/01* (2006.01)
*G06F 3/041* (2006.01)
*G06F 3/044* (2006.01)
*G06F 3/0488* (2013.01)

(52) U.S. Cl.
CPC .............. *G06F 3/044* (2013.01); *G06F 3/011* (2013.01); *G06F 3/0416* (2013.01); *G06F 3/04883* (2013.01)

(58) Field of Classification Search
CPC ........ G06F 3/011; G06F 3/044; G06F 3/0416; G06F 3/04883; H03K 17/955; H03K 17/962
See application file for complete search history.

(56) References Cited

U.S. PATENT DOCUMENTS 4,514,817 A * 4/1985 Pepper .................... F21V 23/00
315/292
5,512,836 A * 4/1996 Chen ...................... G01B 7/023
324/663

(Continued)

FOREIGN PATENT DOCUMENTS

| CN | 103404030 A | 11/2013 |
| CN | 103526991 A | 1/2014 |
| WO | 2014002113 A1 | 1/2014 |

*Primary Examiner* — Amare Mengistu
*Assistant Examiner* — Crystal Mathews
(74) *Attorney, Agent, or Firm* — Frank Lollo; Brooks Kushman P.C.

(57) ABSTRACT

A proximity sensing system may include a conductive first trace and a conductive second trace adjacent to, interleaved with, and electrically isolated from the first trace. A density of the traces varies along a first axis such that rates of change of capacitance between the traces associated with movement, through an electric field, of an object in a direction of the first axis at a constant velocity are indicative of the direction. The sensing system may further include a conductive third trace adjacent to, interleaved with, and electrically isolated from the first trace. A first area between the first trace and second trace is independent of and isolated from a second area between the first trace and the third trace. Also, a density of the first and third traces may vary along the first axis.

6 Claims, 4 Drawing Sheets

(56) References Cited

U.S. PATENT DOCUMENTS

| | | | | |
|---|---|---|---|---|
| 5,827,980 A * | 10/1998 | Doemens | G01B 7/16 | 73/862.626 |
| 6,297,811 B1 * | 10/2001 | Kent | G06F 3/044 | 178/18.01 |
| 6,310,611 B1 * | 10/2001 | Caldwell | H03K 17/955 | 178/18.06 |
| 6,535,200 B2 * | 3/2003 | Philipp | G06F 3/0213 | 178/18.06 |
| 6,825,752 B2 * | 11/2004 | Nahata | E05B 81/78 | 180/273 |
| 7,146,024 B2 * | 12/2006 | Benkley, III | G06K 9/0002 | 324/661 |
| 7,218,124 B1 * | 5/2007 | Mackey | G01D 5/2415 | 324/660 |
| 7,956,438 B2 * | 6/2011 | Quinn | H01L 23/5223 | 257/516 |
| 8,004,499 B2 * | 8/2011 | Geaghan | G06F 3/044 | 345/173 |
| 8,116,063 B2 * | 2/2012 | Yeh | H01G 4/33 | 257/307 |
| 8,502,796 B1 * | 8/2013 | Yilmaz | G06F 3/044 | 178/18.06 |
| 8,537,523 B1 * | 9/2013 | Chen | H01G 4/33 | 361/303 |
| 8,558,346 B1 * | 10/2013 | Cheng | H01L 23/5223 | 257/532 |
| 8,624,609 B2 * | 1/2014 | Philipp | G06F 3/044 | 324/660 |
| 8,686,308 B2 * | 4/2014 | Kuriki | G06F 3/044 | 200/512 |
| 8,860,114 B2 * | 10/2014 | Yen | H01L 23/5223 | 257/306 |
| 8,872,526 B1 * | 10/2014 | Hoshtanar | G06K 9/0002 | 324/658 |
| 8,941,974 B2 * | 1/2015 | Wu | H01L 28/86 | 361/303 |
| 8,970,537 B1 * | 3/2015 | Shepelev | G06F 3/044 | 178/18.01 |
| 9,152,278 B2 * | 10/2015 | Kent | G06F 3/0418 | |
| 9,269,492 B2 * | 2/2016 | Zhu | H01L 28/86 | |
| 9,548,733 B2 * | 1/2017 | Buttolo | H03K 17/955 | |
| 2002/0109677 A1 | 8/2002 | Taylor | | |
| 2003/0001724 A1 | 1/2003 | Willats et al. | | |
| 2006/0047386 A1 * | 3/2006 | Kanevsky | B60K 35/00 | 701/36 |
| 2006/0177212 A1 * | 8/2006 | Lamborghini | B60K 37/06 | 396/287 |
| 2007/0051609 A1 * | 3/2007 | Parkinson | H01H 13/78 | 200/512 |
| 2007/0279395 A1 * | 12/2007 | Philipp | G01R 27/2605 | 345/173 |
| 2007/0291016 A1 * | 12/2007 | Philipp | G01D 5/2405 | 345/174 |
| 2007/0296013 A1 * | 12/2007 | Chang | H01L 23/5223 | 257/306 |
| 2008/0074398 A1 * | 3/2008 | Wright | G06F 3/044 | 345/173 |
| 2008/0164076 A1 * | 7/2008 | Orsley | G06F 3/03543 | 178/18.01 |
| 2008/0205714 A1 * | 8/2008 | Benkley | G06F 3/03547 | 382/126 |
| 2008/0231290 A1 * | 9/2008 | Zhitomirsky | G01F 23/261 | 324/661 |
| 2008/0246496 A1 * | 10/2008 | Hristov | G06F 3/044 | 324/686 |
| 2009/0273573 A1 * | 11/2009 | Hotelling | G06F 3/0362 | 345/173 |
| 2010/0052769 A1 * | 3/2010 | Yamaguchi | G06F 3/03547 | 327/517 |
| 2010/0156839 A1 * | 6/2010 | Ellis | G06F 1/3203 | 345/174 |
| 2010/0250071 A1 * | 9/2010 | Pala | B60K 35/00 | 701/48 |
| 2010/0302201 A1 * | 12/2010 | Ritter | G06F 3/044 | 345/174 |
| 2010/0309167 A1 * | 12/2010 | Nam | G06F 3/044 | 345/174 |
| 2011/0018557 A1 * | 1/2011 | Badaye | G06F 3/044 | 324/658 |
| 2011/0025639 A1 * | 2/2011 | Trend | G06F 3/044 | 345/174 |
| 2011/0062971 A1 * | 3/2011 | Badaye | G06F 3/044 | 324/686 |
| 2011/0095997 A1 * | 4/2011 | Philipp | G06F 3/044 | 345/173 |
| 2011/0157079 A1 * | 6/2011 | Wu | G06F 3/044 | 345/174 |
| 2011/0181387 A1 * | 7/2011 | Popelard | B60R 25/246 | 340/5.2 |
| 2011/0241850 A1 * | 10/2011 | Bosch | B60K 37/06 | 340/384.6 |
| 2011/0309912 A1 * | 12/2011 | Muller | B60R 25/246 | 340/5.72 |
| 2012/0043976 A1 * | 2/2012 | Bokma | H03K 17/955 | 324/679 |
| 2012/0075246 A1 * | 3/2012 | Chang | G06F 3/0416 | 345/174 |
| 2012/0227259 A1 * | 9/2012 | Badaye | G06F 3/044 | 29/846 |
| 2013/0181942 A1 * | 7/2013 | Bulea | G06F 3/044 | 345/174 |
| 2013/0194230 A1 * | 8/2013 | Kawaguchi | G06F 3/0416 | 345/174 |
| 2013/0201348 A1 * | 8/2013 | Li | G06F 3/044 | 348/174 |
| 2013/0271157 A1 * | 10/2013 | Buttolo | H03K 17/955 | 324/647 |
| 2013/0271202 A1 * | 10/2013 | Buttolo | H03K 17/94 | 327/517 |
| 2013/0271203 A1 * | 10/2013 | Salter | H03K 17/94 | 327/517 |
| 2013/0328616 A1 * | 12/2013 | Buttolo | H03K 17/955 | 327/517 |
| 2014/0002405 A1 * | 1/2014 | Salter | H03K 17/962 | 345/174 |
| 2014/0069015 A1 | 3/2014 | Salter et al. | | |
| 2014/0132552 A1 * | 5/2014 | Hoch | G06F 3/044 | 345/174 |
| 2014/0145733 A1 * | 5/2014 | Buttolo | H03K 17/955 | 324/679 |
| 2014/0292396 A1 | 10/2014 | Bruwer et al. | | |
| 2014/0313169 A1 * | 10/2014 | Kravets | G06F 3/044 | 345/178 |
| 2014/0347076 A1 * | 11/2014 | Barton | G06F 3/0488 | 324/663 |
| 2015/0070312 A1 * | 3/2015 | Her | G06F 3/041 | 345/174 |
| 2015/0180471 A1 * | 6/2015 | Buttolo | B60R 16/005 | 307/9.1 |
| 2015/0212620 A1 * | 7/2015 | Kim | G06F 3/044 | 345/174 |
| 2015/0212630 A1 * | 7/2015 | Naito | G06F 3/0412 | 345/174 |
| 2015/0229305 A1 * | 8/2015 | Buttolo | H03K 17/945 | 307/9.1 |
| 2015/0277484 A1 * | 10/2015 | Lin | G06F 1/16 | 345/174 |
| 2015/0370364 A1 * | 12/2015 | Jordan | G06F 3/044 | 345/174 |
| 2016/0054828 A1 * | 2/2016 | Lien | G06F 3/044 | 345/174 |
| 2016/0112044 A1 * | 4/2016 | Salter | H03K 17/955 | 307/116 |
| 2016/0195946 A1 * | 7/2016 | Ahn | G06F 3/044 | 345/173 |

* cited by examiner

MOTION BASED CAPACITIVE SENSOR SYSTEM

TECHNICAL FIELD

This application is generally related to capacitive sensor systems used in vehicle entry systems.

BACKGROUND

Capacitive touch pads also referred to as capacitive sensor pads detect a conductive object or an object with dielectric properties different than air proximate to the pad. The use of capacitive sensor pads has been adopted in many electrical systems including keyless entry systems. Keyless entry systems may provide a convenient way for people to access a locked area including a building, a house, and a vehicle without a key, key-fob or other authentication device. Keyless entry systems are frequently used by people who go jogging, working out, or on an excursion, and prefer not to carry a key or to leave the keys inside the locked area. Keyless entry systems can also be used to allow access to the interior of a locked vehicle to a friend or a child without providing them with the ability to start the vehicle. A typical key-fob has a numerical keypad and is implemented using either mechanical or capacitive buttons. Capacitive technology may provide advantages of better sealing and improved aesthetics compared with mechanical buttons. While intuitive and fast to use, traditional numerical keypad have two shortcomings. First, traditional numerical keypads have rigid constraints in the exterior design requiring a specific numerical graphical interface to be presented to the user. Secondly, traditional numerical keypads may have some security concerns in which thieves have been known to use thermal imaging technology to reconstruct the activation sequence.

SUMMARY

A proximity sensing system includes a conductive first trace and a conductive second trace. The conductive second trace is adjacent to, interleaved with, and electrically isolated from the first trace. And, a density of the traces varies along a first axis such that rates of change of capacitance between the traces associated with movement, through an electric field, of an object in a direction of the first axis at a constant velocity are indicative of the direction.

A controller-implemented method includes outputting by the controller a first signal based on rates of change of capacitance between a first and second trace of a capacitive sensor pad. The first and second traces of the capacitive sensor pad have a first trace density gradient along a first axis within a first area such that the first signal is indicative of a direction of movement of an object through an electric field associated with the capacitive sensor pad at a constant velocity along the first axis.

A proximity sensing system includes first and second traces. The first and second traces are electrically isolated from each other. The first and second traces define a pattern having a trace density that varies along an axis perpendicular to an axis of asymmetry of the pattern. And, rates of change of capacitance between the first and second traces associated with movement through an electric field of an object at a constant velocity in a direction perpendicular to the axis are indicative of the direction.

DETAILED DESCRIPTION

Figure 1:
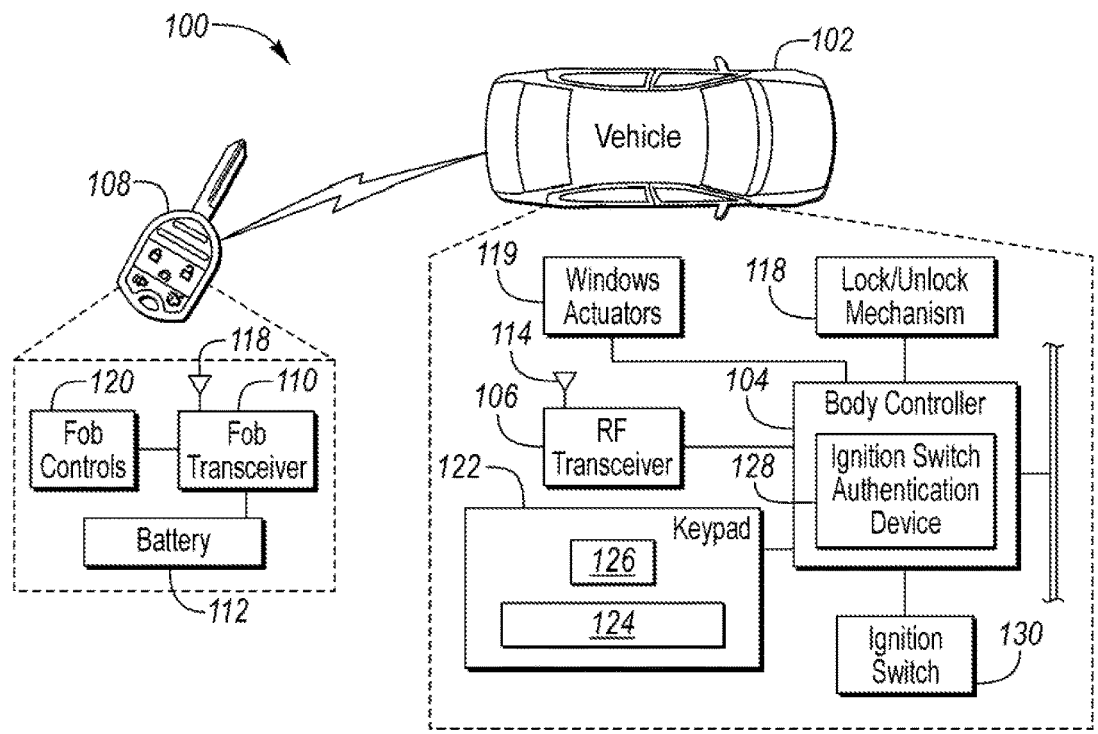
FIG. 1 illustrates an exemplary keyless entry system for a vehicle including a sensor based keypad.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The embodiments of the present disclosure generally provide for a plurality of circuits or other electrical devices. All references to the circuits and other electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any one or more of the electric devices may be configured to execute a computer-program that is embodied in a non-transitory computer readable medium that is programmed to perform any number of the functions as disclosed.

Some vehicle systems include a keypad having a plurality of individual sensors or buttons that each correspond to a numeric character, an alpha character or a combination of alpha-numeric characters. Using the sensors of the keypad, a user may enter in an access code to unlock the vehicle. The access code may include a sequence of alpha-numeric values, a continuous gesture, e.g., a gesture without lifting the finger, or a sequence of swipes or gestures, e.g., a sequence of discrete swipes across the sensor face such as a directional, up/down or left/right swipe. Using the gesture access codes, the user may be able to draw a shape or other pattern that may be used to authenticate the user with the vehicle. Moreover, as the swipe touchpad does not require numbers or other characters printed on or adjacent to it, the touchpad may also include a background logo to enhance the keypad aesthetics and security of the access code.

An improved keypad may utilize a single touchpad in place of the plurality of individual sensors to provide for improved aesthetics as well as for providing additional functionality and reduced system cost. A single sensor may be used to detect motion. However, current sensor pad designs do not allow the determination of the direction of the motion. Here, certain sensor pad designs are disclosed that have a trace density gradient along one axis such that a signal generated by the sensor is indicative of the direction. The sensor pad designs may include trace density gradient along two perpendicular axes and a region of reduced trace density or a trace density void along a single axis such that a signal generated from a motion along one axis is distinguishable from a signal generated from a motion along the other axis due to a dip or bump in the signal due to the void.

Notably, such implementations enhance keypad security, as any lingering finger smudges on the interface cannot be traced back to the entered numbers. Moreover, as the touchpad does not require numbers or other characters printed on or adjacent to it, the touchpad may instead be designed to include a background logo, such as the FORD Blue Oval logo or the LINCOLN logo, to enhance the keypad aesthetics. In some cases, the keypad may display the background logo when the keypad is available to receive user input, such as when the keypad is tapped or when user proximity is detected by the vehicle (e.g., via key fob presence, via capacitive vehicle sensors, etc.).

Once the access code has been entered, e.g., via multi-touch or gesture input, the touchpad may be further configured to display a menu of available options that may be performed. In an example, once the correct combination or swipe pattern is entered, the touchpad may be backlit to show a vehicle profile (e.g., from the side or the top), with specific features highlighted for selection. These features may include, as some non-limiting possibilities, unlocking all doors, unlocking a specific door, opening a vehicle lift-gate, opening vehicle windows, and entering valet mode. Using the vehicle profile, the user may press on any of the highlighted features to invoke the available functions. Accordingly, access to these features may be provided to the user graphically, rather than requiring the user to remember a numeric code or sequence to perform certain commands (e.g., to hold down particular numeric buttons to unlock the vehicle doors).

FIG. 1 illustrates an example keyless entry system 100 for a vehicle 102 having a keypad 122. The system 100 may include a body controller 104 having a radio frequency (RF) transceiver 106. A key fob 108 may be in communication with the RF transceiver 106 of the controller 104 utilizing a fob transceiver 110 powered by a battery 112. An antenna 114 of the RF transceiver 106 may receive RF signals from an antenna 116 of the fob transceiver 110, and may deliver the signals to the RF transceiver 106. An unlock/lock mechanism 118 is operably coupled to the controller 104. The controller 104 is configured to control the unlock/lock mechanism 118 to unlock/lock doors of the vehicle 102 in response to the RF signals transmitted by the key fob 108. Power window actuators 119 may also be operably coupled to the controller 104 such that the controller 104 is configured to cause the various windows (e.g., front and rear door power windows, powered window side vents, power sunroofs and moon-roofs) of the vehicle 102 to open or close. The key fob 108 may include one or more fob controls 120 such as a lock switch and an unlock switch. Accordingly, the controller 104 controls the unlock/lock mechanism 118 to lock the doors of the vehicle 102 in response to a user depressing a lock fob control 120 of the key fob 108, and to unlock the doors of the vehicle 102 in response to the user depressing an unlock fob control 120 of the key fob 108.

The keypad 122 is in electrical communication with the controller 104. The keypad 122 may be positioned on an exterior portion or section of the vehicle 102. In one example, the keypad 122 may be hardwired to the controller 104. In another example, the keypad 122 may be in RF communication with the controller 104 (e.g., via the RF antenna 114). The keypad 122 includes a touchpad 124 configured to receive user input. In some examples, the touchpad 124 may support multi-touch gestures to allow the keypad 122 to detect multiple simultaneous finger presses. Additionally or alternatively, the touchpad 124 may support swipe or other gestures, to allow the keypad 122 to detect such movements performed by the user.

In some examples, the keypad 122 may further include a separate display 126 configured to display to the user the current character being entered into the keypad 122. In other examples, the touchpad 124 may additionally or alternately include integrated display functionality on the surface of the touchpad 124, e.g., to display a logo when receiving touch input, and/or to display vehicle profile or other graphics to facilitate selection of vehicle 102 features.

In an example, the keypad 122 may transmit commands via hardwired signals to the controller 104 responsive to the user interacting with the touchpad 124. In another example, the keypad 122 may transmit commands via RF signals to the controller 104. The controller 104 controls the unlock/lock mechanism 118 to unlock/lock the doors in response to receiving the commands, e.g., two or more signals (RF or hardwired) which correspond to a valid sequence of alpha, numeric, or alpha-numeric characters.

The key fob 108 may be implemented in connection with a base remote entry system, a passive entry passive start (PEPS) system or a passive anti-theft system (PATS). With the PEPS system, the controller 104 may control the unlock/lock mechanism 118 to unlock the door in response to the controller 104 determining that the key fob 108 is a predetermined distance away from the vehicle 102. In such a case, the key fob 108 automatically (or passively) transmits encrypted RF signals (e.g., without user intervention) in order for the controller 104 to decrypt (or decode) the RF signals and to determine if the key fob 108 is within the predetermined distance and are authorized. It is to be noted that with the PEPS implementation, the key fob 108 also generates RF signals which correspond to encoded lock/unlock signals in response to a user depressing a lock fob control 120 or an unlock fob control 120. In addition, with the PEPS system, a key may not be needed to start the vehicle 102. The user in this case may be required to depress the brake pedal switch or perform some predetermined operation prior to depressing a start switch after the user has entered into the vehicle 102. In the PATS implementation, the key fob 108 may operate as a conventional key fob in order to unlock/lock the vehicle 102. With the PATS implementation, a key (not shown) is generally needed to start the vehicle 102. The key may include a RF transmitter embedded therein to authenticate the key to the vehicle 102.

The controller 104 includes an ignition switch authentication device 128. The ignition switch authentication device 128 may also include an RF receiver (not shown) and an antenna (not shown) for receiving RF signals transmitted by the RF transmitters of the keys. It should be noted that the ignition switch authentication device 128 may be implemented as a standalone controller (or module). The ignition switch authentication device 128 is configured to authenticate the particular type of mechanism used to start the vehicle 102. For example, with the PATS implementation, the key is inserted into an ignition switch 130 to start the vehicle 102. In such a case, the RF transmitter of the key transmits RF signals having encrypted data therein to the receiver of the ignition switch authentication device 128. The ignition switch authentication device 128 decrypts the data to authenticate the key prior to allowing the user to start the vehicle 102.

With the PEPS implementation, as noted above, a key is not needed to start the vehicle 102. In such a case, the ignition switch authentication device 128 authenticates the RF encrypted data passively transmitted by the transmitter 108a-108n to allow the user to start the engine of the vehicle 102. As noted above, in addition to the authentication device 128 authenticating the RF encrypted data, the user may perform a predetermined operation (e.g., pull handle of a door, or open door, toggle the brake pedal switch, or other operation) prior to depressing a start switch to start the vehicle 102. The system 100 contemplates a number of other operations from those listed prior to depressing the start switch to start the vehicle 102.

As mentioned above, the touchpad 124 may implement multi-touch technology configured to recognize multiple finger contacts and receive access codes entered by the user. To enter a number, rather than pressing a switch of the keypad 122 assigned to the number, the user may instead simultaneously press a number of fingers to the touchpad 124 corresponding to the desired number. Thus, to enter a digit of an access code, such as a personal code or factory code, the user may simply touch the touchpad 124 with a desired number of fingers, at various locations of the touchpad 124. As an access code may be entered via the keypad 122 using arbitrary locations across the touchpad 124, it may be difficult for the unauthorized user to learn the user's code merely by watching. Moreover, as the touchpad 124 may receive numerical input according to a number of touches or may receive other gesture input, numbers or other indications need not be placed on or near the touchpad 124 of the keypad 122, improving keypad 122 aesthetics.

Figures 2A, 2B:
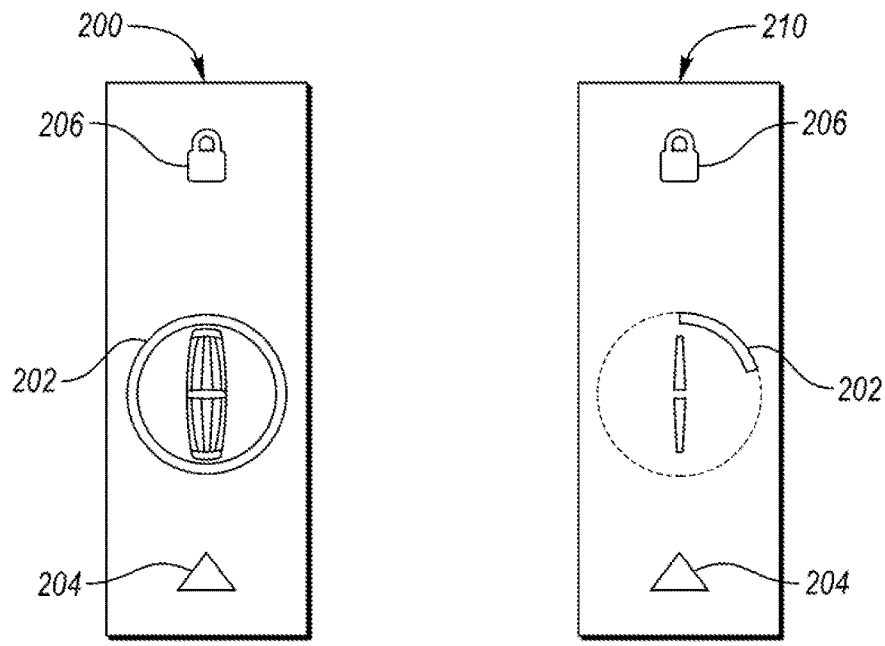
FIG. 2A is an exemplary illustration of a vehicle sensor pad.
FIG. 2B is an exemplary illustration of the vehicle sensor pad displaying data after receiving user input.

FIG. 2A is an exemplary illustration of a vehicle keypad 200. The vehicle keypad 200 may include a first area 202, a second area 204 and a third area 206. The first area may include a light or an illuminated display which may display an image or a logo and may be coupled with a discrete sensor or a region of a sensor common with the first and second area. The second area may include a light or an illuminated display which may display an image and may be coupled with a discrete sensor or a region of a sensor common with the first and second area. The third area may include a display to provide feedback such as a status of the system. FIG. 2B is an exemplary illustration of the vehicle keypad displaying data 210 after receiving user input. The displayed data is indicative of a count of a modulo counter, an indicator on increasing the modulo counter and an indicator of the status of the keypad system. The indicator may be a single sensor or it may be two sensors: one for increasing and one for decreasing the modulo count. Also, the indicator may be a single sensor with a trace density gradient such that the module counter is increased based on the direction of a swipe. For example, a swipe up would increase the counter and a swipe down would decrease the counter. Once the desired value from the counter is displayed, a user may touch the sensor in the first area 202 to enter that value such that a sequence of entered values would constitute an access code. When an access code entered matches a key code, the keypad may send a message to the body controller 104 to lock or unlock the mechanism 118.

Figure 3A:
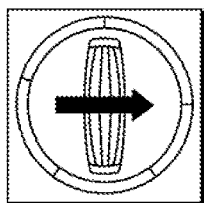
FIGS. 3A-3H are exemplary illustrations of user swipe motions a vehicle sensor system may detect.
Figure 3B:
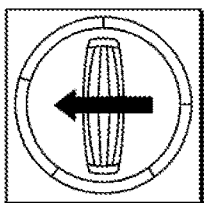
Figure 3C:
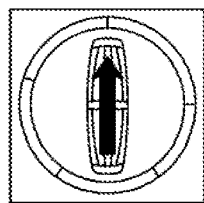
Figure 3D:
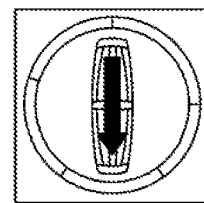
Figure 3E:
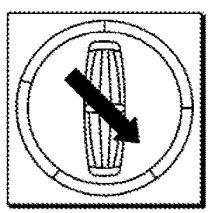
Figure 3F:
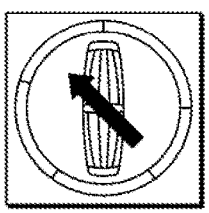
Figure 3G:
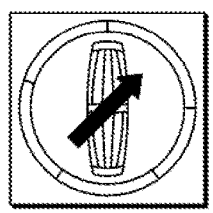
Figure 3H:
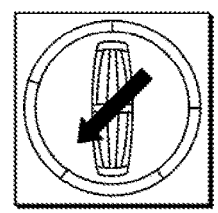

FIGS. 3A-3H are exemplary illustrations of user swipe motions a keypad may detect. FIG. 3A would illustrate a horizontal front to back swipe on a keypad mounted on a vehicle door pillar. FIG. 3B would illustrate a horizontal back to front swipe on the keypad mounted on the vehicle door pillar. FIG. 3C would illustrate a vertical upward swipe on the keypad mounted on the vehicle door pillar. FIG. 3D would illustrate a vertical downward swipe on the keypad mounted on the vehicle door pillar. FIG. 3E would illustrate a downward to the rear swipe on the keypad mounted on the vehicle door pillar. FIG. 3F would illustrate an upward to the front swipe on the keypad mounted on the vehicle door pillar. FIG. 3G would illustrate an upward to the rear swipe on the keypad mounted on the vehicle door pillar. FIG. 3H would illustrate a downward to the front swipe on the keypad mounted on the vehicle door pillar. Swipes on a keypad may be translated into alpha-numeric characters for easy memory such as a "U" or "1" for a vertical upward swipe, a "D" or "2" for a vertical downward swipe, an "L" or "3" for a horizontal swipe to the left, an "R" or "4" for a horizontal swipe to the right and an "X" or "5" for any diagonal swipe. Alternatively, a diagonal swipe may be individually classified such as a diagonal swipe from the top left to the bottom right as an "A" or "6", a diagonal swipe from the bottom left to the top right as a "B" or "7", a diagonal swipe from the top right to the bottom left as a "C" or "8", and a diagonal swipe from the bottom right to the top left as an "E" or "9".

Figure 4:
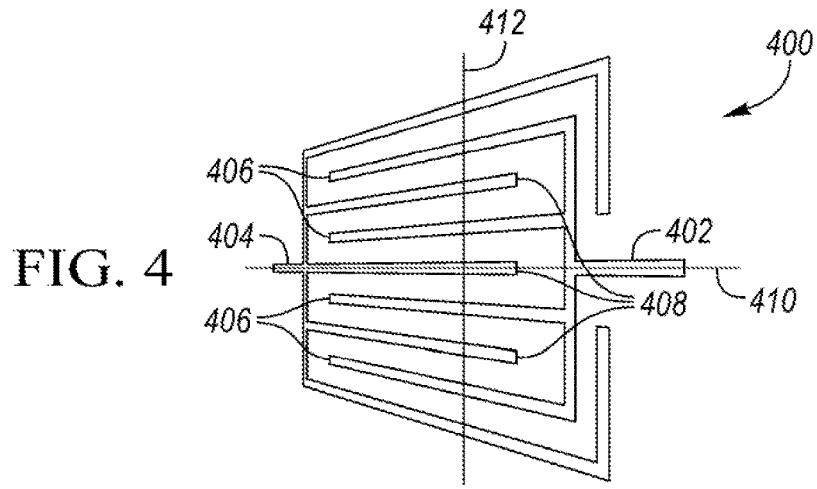
FIG. 4 is an exemplary illustration of a proximity sensor pad having a trace density gradient.

FIG. 4 is an exemplary illustration of a proximity sensor pad 400 having a trace density gradient. This exemplary illustration is shown generally trapezoidal, but may be implemented in other shapes such as a square, a circle, a rectangle, or it may be an amorphous shape to meet a specific aesthetic or functional requirement. The pad 400 includes a first trace 402 and a second trace 404. The first trace 402 and second trace 404 are conductive traces and may be made of a metallic thin film, a conductive composite or a conductive polymer. The first trace 402 may include a plurality of first fingers 406 that may be in proximity with a plurality of second fingers 408. The fingers 406 are electrically isolated from fingers 408 allowing capacitive coupling between the traces 402 and 404. The fingers 406 may be interleaved with fingers 408 to increase an area of proximity. The configuration is such that an electric field induced by a voltage applied across the first trace 402 and second trace 404 produces a signal based on a change in capacitance between the traces 402 and 404. Also, the configuration is such that a trace density of the first and second traces 402 and 404 varies along a first axis 410. The configuration of the traces 402 and 404 is shown asymmetrical in reference to a second axis 412 perpendicular to the first axis 410.

However, the configuration of the traces 402 and 404 may be symmetrical in reference to the second axis 412.

Figure 5:
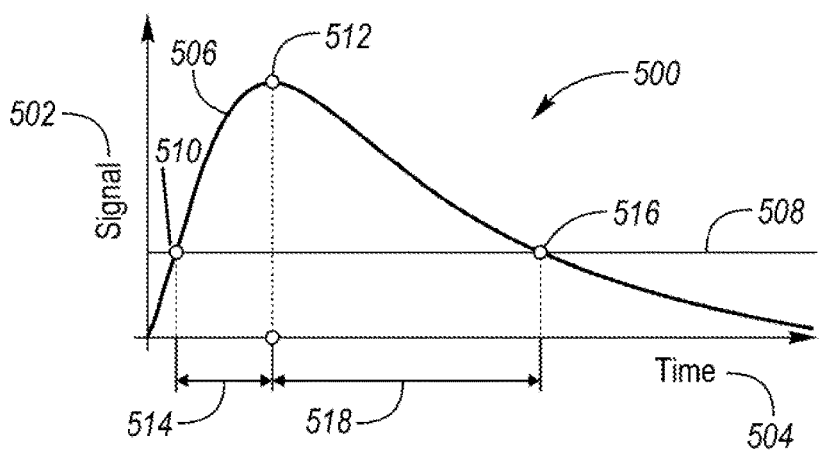
FIG. 5 is an exemplary graphical view of a signal from the proximity sensor pad of FIG. 4 based on a swipe.

FIG. 5 is an exemplary graphical view of a signal 500 from the proximity sensor pad of FIG. 4 based on a swipe from the left side of the sensor with to right side of the sensor. This exemplary profile is associated with movement, through an electric field, of an object proximate to the traces 402 and 404 in a direction of the first axis 410 at a constant velocity. When an object proximate to the traces 402 and 404 moves along the first axis 410, there is a change in capacitance that may be represented as a signal 502. The signal 502 varies with respect to time 504 as it generally moves along the first axis 410 due to the trace density gradient. The signal profile is shown as 506 and a threshold 508 is applied to increase the stability of the system and to avoid signal noise from being interpreted as an object. The signal crossing the threshold 508 at point 510 may activate a timer to measure the time needed for the signal to reach a maximum value or a first stationary point 512 in which the rate of change of capacitance is equal to zero or stationary. A first rate of change is determined based on a rise time 514 and the associated signal change from point 510 to the point 512. After reaching the maximum value or stationary point 512, the rate of change decreases until the signal crosses the threshold 508 at point 516. A second rate of change is determined based on the fall time 518 and the associated signal change from point 512 to the point 516. The rates of change of capacitance are different between the rise time 514 and the fall time 518 due to the trace density gradient. If the direction of motion or swipe was in the opposite direction, the rise time would be approximately equal to 518 and the fall time would be approximately equal to 514. Based on the difference in rates of changes of capacitance, a direction may be determined, with left to right corresponding to time interval 514 less than time interval 518, and right to left corresponding to time interval 518 less than time interval 514.

Figure 6:
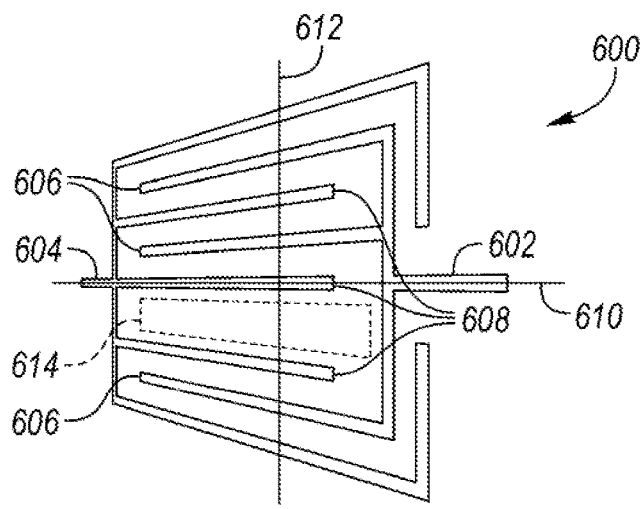
FIG. 6 is an exemplary illustration of a proximity sensor pad having a trace density gradient and a region of reduced trace density.

FIG. 6 is an exemplary illustration of a proximity sensor pad 600 having a trace density gradient and a region of reduced trace density. This exemplary illustration is shown generally trapezoidal, but may be implemented in other shapes such as a square, a circle, a rectangle, or it may be an amorphous shape to meet a specific aesthetic or functional requirement. The pad 600 includes a first trace 602 and a second trace 604. The first trace 602 and second trace 604 are conductive traces and may be made of a metallic thin film, a conductive composite or a conductive polymer. The first trace 602 may include a plurality of first fingers 606 that may be in proximity with a plurality of second fingers 608. The fingers 606 are electrically isolated from fingers 608 allowing capacitive coupling between the traces 602 and 604. The fingers 606 may be interleaved with fingers 608 to increase an area of proximity. The configuration is such that an electric field induced by a voltage applied across the first trace 602 and second trace 604 produces a signal based on a change in capacitance between the traces 602 and 604. Also, the configuration is such that a trace density of the first and second traces 602 and 604 varies along a first axis 610. The configuration of the traces 602 and 604 is shown asymmetrical in reference to a second axis 612 perpendicular to the first axis 610. However, the configuration of the traces 602 and 604 may be symmetrical in reference to the second axis 612. In this exemplary illustration, a region of reduced trace density 614 is offset from a median of the first axis 610. The region of reduced trace density 614 may be above or below the median.

Figure 7A:
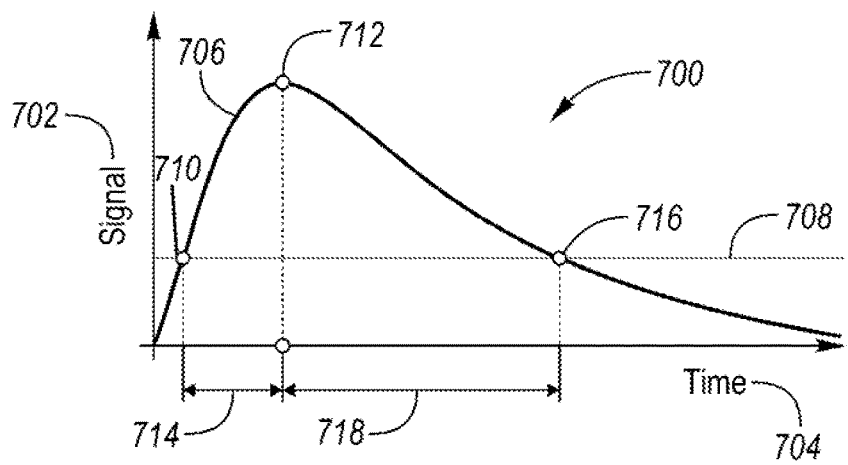
FIGS. 7A-7B are exemplary graphical views of signals from the proximity sensor pad of FIG. 6 based on swipes.

FIG. 7A is an exemplary graphical view of a signal 700 from the proximity sensor pad of FIG. 6 based on a horizontal swipe, left to right. This exemplary profile is associated with movement, through an electric field, of an object proximate to the traces 602 and 604 in a direction of the first axis 610 at a constant velocity from the left side with higher density interlocking traces 606 and 608, to the right side with lower density interlocking traces, 606 and 608. When an object proximate to the traces 602 and 604 moves along the first axis 610, there is a change in capacitance that may be represented as a signal 702. The signal 702 varies with respect to time 704 as it generally moves along the first axis 610 due to the trace density gradient. The signal profile is shown as 706 and a threshold 708 is applied to increase the stability of the system and to avoid signal noise from being interpreted as an object. The signal crossing the threshold 708 at point 710 may activate a timer to measures the time needed for the signal to reach a maximum value or a first stationary point 712 in which the rate of change of capacitance is equal to zero or stationary. A first rate of change is determined based on a rise time 714 and the associated signal change from point 710 to the point 712. After reaching the maximum value or stationary point 712, the rate of change decreases until the signal crosses the threshold 708 at point 716. A second rate of change is determined based on the fall time 718 and the associated signal change from point 712 to the point 716. The rates of change of capacitance are different between the rise time 714 and the fall time 718 due to the trace density gradient. If the direction of motion or swipe was in the opposite direction, the rise time would be approximately equal to 716 and the fall time would be approximately equal to 714. Based on the difference in rates of changes of capacitance, a direction may be determined. Note that an horizontal swipe will results in a profile 706 with only one peak 712.

Figure 7B:
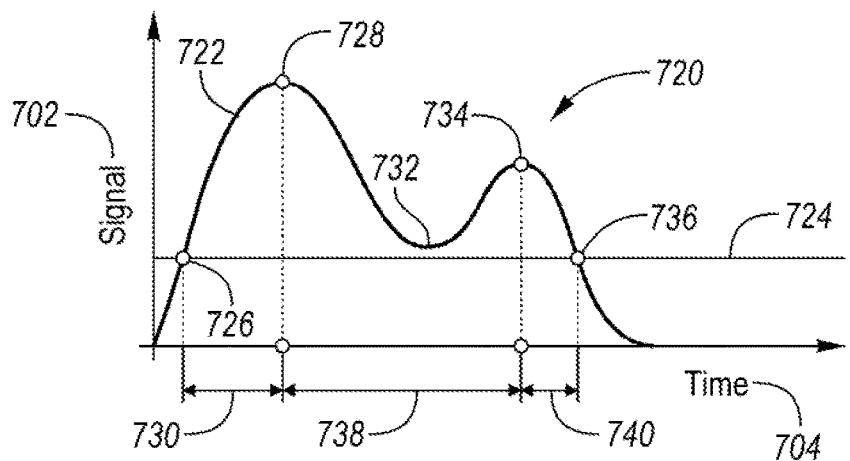

FIG. 7B is an exemplary graphical view of a signal 720 from the proximity sensor pad of FIG. 6 based on a vertical swipe, from top to bottom. This exemplary profile is associated with movement, through an electric field, of an object proximate to the traces 602 and 604 in a direction of the second axis 612 at a constant velocity. When an object proximate to the traces 602 and 604 moves along the second axis 612, there is a change in capacitance that may be represented as a signal 702. The signal 702 varies with respect to time 704 as it generally moves along the second axis 612 due to the region of reduced trace density 614. The signal profile is shown as 722 and a threshold 724 is applied to increase the stability of the system and to avoid signal noise from being interpreted as an object. The signal crossing the threshold 724 at point 726 may activate a timer to measure the time needed for the signal to reach a maximum value or a first stationary point 728 in which the rate of change of capacitance is equal to zero or stationary. A first rate of change is determined based on a rise time 730 and the associated signal change from point 726 to the point 728. After reaching the maximum value or stationary point 728, the rate of change decreases until the signal reaches a minimum or second stationary point at 732 above the threshold 724 at which point the rate of change increases to a second maximum or third stationary point at 734. The second stationary point 732 forms a dip or valley in the signal profile 722 due to the region of reduced trace density. One implementation to detect this valley may include looking for localized maximums above the threshold 724. This may capture points 728 and 734 allowing an intermediate time 738 between two maximums based on two localized maximums above the threshold. An alternative method may include detecting all stationary points and providing a count of stationary points. After the second maximum 734, the signal will continue until it crosses the threshold at 736 with a final fall time 740 between point 734 and point 736. The rates values of the localized maximums 728 and 734 are different due to the region of reduced trace density 614. With a top to bottom direction of motion, and the region of reduced trace sensitivity 614 in the lower section, the maximum value 728 is larger than the second maximum 734. If the direction of motion or swipe was in the opposite direction, from the bottom to the top, the maximum value 728 would be smaller than 734. Based on the difference in rates of changes of capacitance, 714 and 718, a direction may be determined along a first axis 610. Also, motion along the second axis 612 may be distinguished from motion along the first axis 610 due to the presence of additional stationary points 732 and 734. Further, based on the rates of changes and ratio of values between stationary points, motion diagonal to the first and second axes 610 and 612 may be determined.

Figure 8:
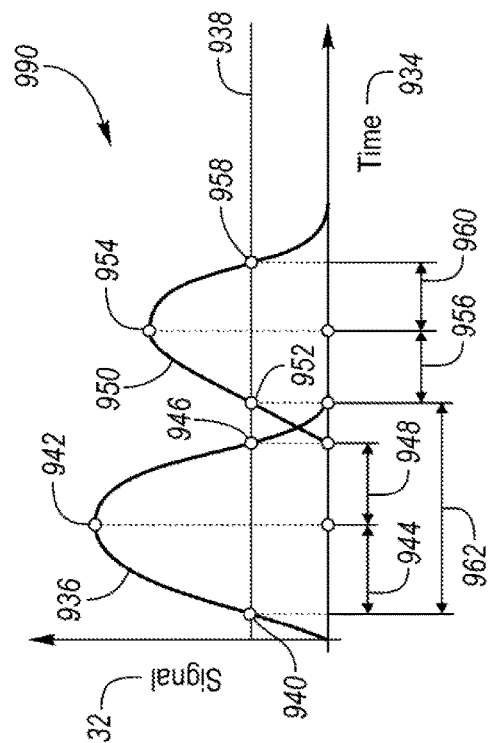
FIG. 8 is an exemplary illustration of a multiple zone proximity sensor pad having a trace density gradient.

FIG. 8 is an exemplary illustration of a multiple zone proximity sensor pad 800 having a trace density gradient. This exemplary illustration is shown generally trapezoidal, but may be implemented in other shapes such as a square, a circle, a rectangle, or it may be an amorphous shape to meet a specific aesthetic or functional requirement. The pad 800 includes a first trace 802, a second trace 804 and a third trace 806. The first trace 802, second trace 804 and third trace 806 are conductive traces and may be made of a metallic thin film, a conductive composite or a conductive polymer. The first trace 802 may include a plurality of first fingers 808 that may be in proximity with a plurality of second fingers 810. Also, the plurality of first fingers 808 that may be in proximity with a plurality of third fingers 812. The fingers 808 are electrically isolated from fingers 810 allowing capacitive coupling between the traces 808 and 810. Also, the fingers 808 are electrically isolated from the fingers 812 allowing capacitive coupling between the traces 808 and 812. The fingers 808 may be interleaved with fingers 810 to create a first area of proximity or region of sensitivity. Also, the fingers 808 may be interleaved with fingers 812 to create a second area of proximity or region of sensitivity. The configuration is such that an electric field induced by a voltage applied across the first trace 802 and second trace 804 produces a first signal based on a change in capacitance between the traces 802 and 804. And, the configuration is such that an electric field induced by a voltage applied across the first trace 802 and third trace 806 produces a second signal based on a change in capacitance between the traces 802 and 806. Further, the configuration is such that a trace density of the first and second traces 802 and 804 varies along a first axis 816. And, the configuration is such that a trace density of the first and third traces 802 and 806 varies along a first axis 816. The configuration of the traces 802, 804, and 806 is shown asymmetrical in reference to a second axis 814 perpendicular to the first axis 816.

However, the configuration of the traces 802, 804, and 806 may be symmetrical in reference to the second axis 814.

Figure 9A:
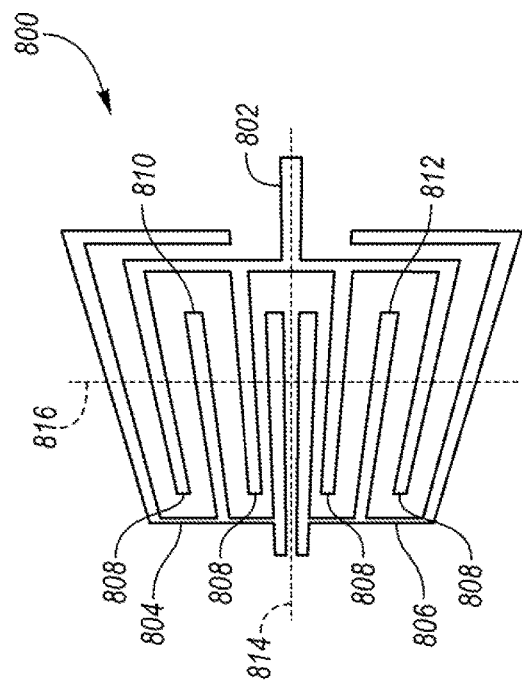
FIGS. 9A-9C are exemplary graphical views of signals from the multiple zone proximity sensor pad of FIG. 8.

FIGS. 9A is an exemplary graphical view 900 of signal intensity 902 from the multiple zone proximity sensor pad of FIG. 8 based on a swipe in respect to a position 904 of an object along the horizontal axis, from the left side to the right side of the sensor 800. This exemplary profile is associated with movement, through an electric field, of an object proximate to the sensor composed of the traces 802 and 804 in a direction of the first axis 814 at a constant velocity from right to left. When an object proximate to the traces 802 and pg25/804 moves along the first axis 814, there is a change in capacitance that may be represented as a first signal 906. The first signal 906 varies with respect to time 904 as it generally moves along the first axis 814 due to the trace density gradient. The signal profile is shown as 906 and a threshold 908 is applied to increase the stability of the system and to avoid signal noise from being interpreted as an object. The signal crossing the threshold 908 at point 910 may activate a timer to measure the time needed for the signal to reach a maximum value or a first stationary point 912 in which the rate of change of capacitance is equal to zero or stationary. A first rate of change is determined based on a rise time 914 and the associated signal change from point 910 to the point 912. After reaching the maximum value or stationary point 912, the rate of change decreases until the signal crosses the threshold 908 at point 916. A second rate of change is determined based on the fall time 918 and the associated signal change from point 912 to the point 916. The rates of change of capacitance are different between the rise time 914 and the fall time 916 due to the trace density gradient. If the direction of motion or swipe was in the opposite direction, the rise time would be approximately equal to 918 and the fall time would be approximately equal to 914 and the profile would be symmetrical along the signal axis. Based on the difference in rates of changes of capacitance, a direction may be determined, with left to right corresponding to time interval 914 less than time interval 918, and right to left corresponding to time interval 918 less than time interval 914. Likewise, a profile of a second signal 920, generated by the finger interaction with the sensor composed of traces 802 and 806, can be compared with the first signal 906.

Also, the signal 920 crossing the threshold 908 at point 922 may activate a timer to measure the time needed for the signal to reach a maximum value or a second stationary point 924 in which the rate of change of capacitance is equal to zero or stationary. A first rate of change is determined based on a rise time 926 and the associated signal change from point 922 to the point 924. After reaching the maximum value or stationary point 924, the rate of change decreases until the signal crosses the threshold 908 at point 928. Another rate of change is determined based on the fall time 930 and the associated signal change from point 924 to the point 928. The rates of change of capacitance are different between the rise time 926 and the fall time 930 due to the trace density gradient. If the direction of motion or swipe was in the opposite direction, the rise time would be approximately equal to 930 and the fall time would be approximately equal to 926.

Figure 9B:
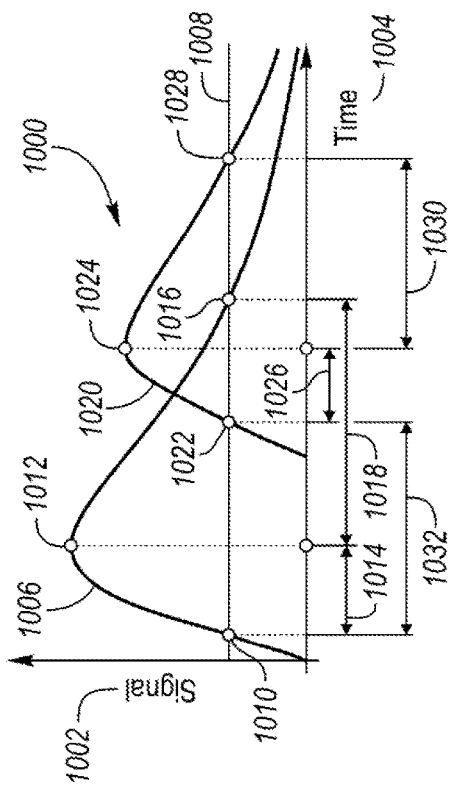

FIG. 9B is an exemplary graphical view of a signal 990 from the proximity sensor pad of FIG. 8 based on a swipe along the vertical axis. This exemplary profile is associated with movement, through an electric field, of an object proximate to the traces 802 and 804 in a direction of the second axis 816 at a constant velocity, in a downward direction. When an object proximate to the traces 802 and 804 moves along the second axis 816, there is a change in capacitance that may be represented as a signal 936. The signal 932 varies with respect to time 934 as it generally moves along the second axis 816 due to the trace density gradient. The signal profile is shown as 932 and a threshold 938 is applied to increase the stability of the system and to avoid signal noise from being interpreted as an object. The signal crossing the threshold 938 at point 940 may activate a timer to measures the time needed for the signal to reach a maximum value or a first stationary point 942 in which the rate of change of capacitance is equal to zero or stationary.

A first rate of change is determined based on a rise time 944 and the associated signal change from point 940 to the point 942. After reaching the maximum value or stationary point 942, the rate of change decreases until the signal crosses the threshold 938 at point 946. A second rate of change is determined based on the fall time 948 and the associated signal change from point 942 to the point 946. The rates of change of capacitance may be different between the rise time 944 and the fall time 948 based on the sensor pad design, however the design may be symmetrical along a second axis 816.

Also, this exemplary graph illustrates the movement through an electric field, of an object proximate to the traces 802 and 806 in a direction of the second axis 816 at a constant velocity in a downward direction. When an object proximate to the traces 802 and 806 moves along the second axis 816, there is a change in capacitance that may be represented as a signal 932. The signal 932 varies with respect to time 934 as it generally moves along the second axis 816 due to the trace density gradient. The signal profile is shown as 950 and a threshold 938 is applied to increase the stability of the system and to avoid signal noise from being interpreted as an object. The signal crossing the threshold 938 at point 952 may activate a timer to measures the time needed for the signal to reach a maximum value or a first stationary point 954 in which the rate of change of capacitance is equal to zero or stationary. A first rate of change is determined based on a rise time 956 and the associated signal change from point 952 to the point 954. After reaching the maximum value or stationary point 954, the rate of change decreases until the signal crosses the threshold 938 at point 958. A second rate of change is determined based on the fall time 960 and the associated signal change from point 954 to the point 958. The rates of change of capacitance may be different between the rise time 956 and the fall time 960 based on the geometry of the sensor pad design. The dual pad design allows a swipe along the second axis 816 to be distinguishable over a swipe in the horizontal direction based on a delay time 962 between the first profile 936 and the second profile 950. Based on the first profile 936, the second profile 950 and the delay time 962, the vertical nature of the swipe may be determined.

Figure 9C:
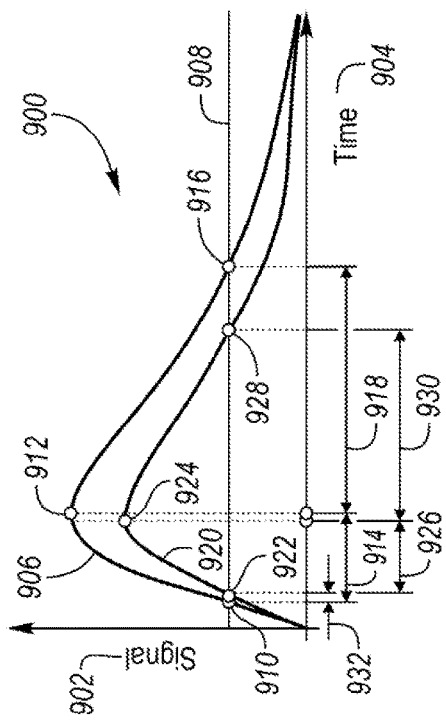

FIG. 9C is an exemplary graphical view 1000 of signals from the multiple zone proximity sensor pad of FIG. 8 based on a swipe diagonal to the trace density gradient. These signals indicate diagonal motion having a direction from a corner of the pad in the first area in which the trace gradient is high to a corner of the pad in the second area in which the trace gradient is low. This exemplary profile is associated with movement, through an electric field, of an object proximate to the traces 802 and 804 in a direction diagonal to axes 814 and 816 at a constant velocity. When an object proximate to the traces 802 and 804 moves along a diagonal path relative to the first axis 814, there is a change in capacitance that may be represented as a signal 1002. The signal 1002 varies with respect to time 1004 as it generally moves relative to the first axis 814 due to the trace density gradient. The signal profile is shown as 1006 and a threshold 1008 is applied to increase the stability of the system and to avoid signal noise from being interpreted as an object. The signal crossing the threshold 1008 at point 1010 may activate a timer to measure the time needed for the signal to reach a maximum value or a first stationary point 1012 in which the rate of change of capacitance is equal to zero or stationary. A first rate of change is determined based on a rise time 1014 and the associated signal change from point 1010 to the point 1012. After reaching the maximum value or stationary point 1012, the rate of change decreases until the signal crosses the threshold 1008 at point 1016. A second rate of change is determined based on the fall time 1018 and the associated signal change from point 1010 to the point 1016. The rates of change of capacitance are different between the rise time 1014 and the fall time 1018 due to the trace density gradient. If the direction of motion or swipe was in the opposite direction, the rise time would be approximately equal to 1016 and the fall time would be approximately equal to 1014. Based on the difference in rates of changes of capacitance, a direction may be determined.

Also, this exemplary profile is associated with movement, through an electric field, of an object proximate to the traces 802 and 806 in a direction diagonal to the axes 814 and 816 at a constant velocity. When an object proximate to the traces 802 and 806 moves along a diagonal to axis 814 and 816, there is a change in capacitance that may be represented as a signal 1002. The signal 1002 varies with respect to time 1004 due to the trace density gradient. The signal profile is shown as 1020 and a threshold 1008 is applied to increase the stability of the system and to avoid signal noise from being interpreted as an object. The signal crossing the threshold 1008 at point 1022 may activate a timer to measure the time needed for the signal to reach a maximum value or a first stationary point 1024 in which the rate of change of capacitance is equal to zero or stationary. A first rate of change is determined based on a rise time 1026 and the associated signal change from point 1022 to the point 1024. After reaching the maximum value or stationary point 1024, the rate of change decreases until the signal crosses the threshold 1008 at point 1028. A second rate of change is determined based on the fall time 1030 and the associated signal change from point 1024 to the point 1028. The rates of change of capacitance are different between the rise time 1026 and the fall time 1030 due to the trace density gradient. If the direction of motion or swipe was in the opposite direction, the rise time would be approximately equal to 1030 and the fall time would be approximately equal to 1026. Based on the difference in rates of changes of capacitance, a direction along the horizontal axis 814 may be determined. A delay 1032 may be determined using the first crossing at point 1010 and the second crossing at point 1022. Based on the delay 1032, the first profile 1006 and the second profile 1020, direction of the swipe along the vertical axis 816 may be determined.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A sensing system comprising:

electrically isolated and interleaved conductive transmitting and receiving traces, a density of the traces varying along two axes such that rates of change of a single capacitance signal from the receiving trace associated with movement of an object through an electric field associated with the traces describes, in two dimensions, a direction of the movement; and a controller to output a signal indicating the direction based on the single capacitance signal.

2. The sensing system of claim 1 further including:

a conductive second receiving trace adjacent to, interleaved with, and electrically isolated from the transmitting trace.

3. The sensing system of claim 2 further comprising:

a display, wherein the controller is further programmed to
increment a modulo counter in response to a first signal based on a first change in capacitance between the transmitting and receiving traces, output a value of the counter on the display, enter the value of the counter in a memory in response to a second signal based on a second change in capacitance between the transmitting and second receiving traces to generate an access code, and unlock a door lock system based on the access code matching a key code.

4. The sensing system of claim 2, wherein the controller is further programmed to generate an access code in response to a sequence of swipes, each swipe based on a second signal being a change in capacitance between the transmitting and second receiving traces, and unlock a door lock based on the access code matching a key code.

5. The sensing system of claim 1, wherein the transmitting and receiving traces define a pattern that is asymmetrical.

6. The sensing system of claim 5, wherein the pattern is trapezoidal, square or circular.

* * * * *